United States Patent
Chen

(10) Patent No.: US 6,594,195 B2
(45) Date of Patent: Jul. 15, 2003

(54) LOW-POWER, HIGH-DENSITY SEMICONDUCTOR MEMORY DEVICE

(75) Inventor: Wenliang Chen, Portland, OR (US)

(73) Assignee: Cascade Semiconductor Corporation, Portland, OR (US)

(*) Notice: Subject to any disclaimer, the term of this patent is extended or adjusted under 35 U.S.C. 154(b) by 0 days.

(21) Appl. No.: 09/955,242

(22) Filed: Sep. 17, 2001

(65) Prior Publication Data

US 2003/0053329 A1 Mar. 20, 2003

(51) Int. Cl.[7] .................................................. G11C 8/00
(52) U.S. Cl. ............................. 365/230.04; 365/230.06
(58) Field of Search .......................... 365/149, 189.04, 365/230.04, 230.06, 189.01

(56) References Cited

U.S. PATENT DOCUMENTS

| | | | |
|---|---|---|---|
| 5,289,421 A | 2/1994 | Lee et al. ................ | 365/206 |
| 5,592,411 A | 1/1997 | Tai .......................... | 365/145 |
| 5,781,483 A | 7/1998 | Shore ..................... | 365/200 |
| 5,812,483 A | 9/1998 | Jeon et al. ............. | 365/230.06 |
| 6,122,213 A * | 9/2000 | Shore ..................... | 365/222 |
| 6,166,942 A | 12/2000 | Vo et al. ................. | 365/63 |
| 6,215,720 B1 * | 4/2001 | Amano et al. ........ | 365/230.03 |
| 6,285,618 B1 * | 9/2001 | Shore ..................... | 365/200 |

OTHER PUBLICATIONS

PCT International Search Report dated Feb. 8, 2002 for International Application No. PCT/US01/28911.
Mitsubishi Electric Data Sheet, revision–K2.0e, '99.03.10 (M5M5V408BFP, TP, RT, KV).
Fujitsu Semiconductor Data Sheet, Memory Low Power SRAM Interface FCRAM™ (MB82D01171A–90/–90L/–90LL). ©Fujitsu Limited, 2000.

* cited by examiner

Primary Examiner—Thong Le
(74) Attorney, Agent, or Firm—Stoel Rives LLP

(57) ABSTRACT

An improved memory device employs a DRAM array for data storage. In the device, a special row address decoder simultaneously asserts a corresponding unique pair of the wordlines in response to each received valid row address, so that a single valid row address simultaneously accesses two rows of memory cells in the array. The device differentially writes and reads each bit of data across a pair of memory cells; each one of the pair of memory cells being within a different respective row of the array, and the two different rows together corresponding to one of the unique pairs of wordlines asserted by the row address decoder responsive to a valid row address. This arrangement obviates the need for high voltage boosting circuits and thereby reduces power consumption.

14 Claims, 5 Drawing Sheets

DRAM array
(Prior Art)

LOW-POWER, HIGH-DENSITY SEMICONDUCTOR MEMORY DEVICE

TECHNICAL FIELD

This invention is in the field of semiconductor integrated circuit memory devices and, more specifically, is directed to reducing power consumption in semiconductor integrated circuit random access memory devices.

BACKGROUND OF THE INVENTION

A variety of semiconductor integrated circuit memory devices are known. They offer users various combinations of speed, power and density tradeoffs. Memory arrays can be implemented as individual chip products or as components of ASICs or SOC's (embedded memory). Generally, semiconductor random access memory devices can be categorized as falling into two major categories, DRAM (dynamic random access memory) and SRAM (static random access memory). In general, one memory cell stores one bit of information. Large numbers of memory cells are organized into one or more memory arrays in a single integrated circuit, providing many millions of cells in some DRAM devices.

A conventional DRAM memory cell has one transistor and one capacitor, as illustrated in FIG. 1. As a consequence of this simple structure, DRAM cells are typically more than 10 times smaller than an SRAM cell at the same technology generation. To write to the DRAM cell, a voltage above VCC (typically about 1V above VCC) is applied to the wordline WL while data is applied to bit line BL. The resulting voltage at the storage node is 0 or VCC. To read the cell, a voltage above VCC (typically about 1V above VCC) is applied to WL, and the voltage difference between the bit line BL and a non-selected bit line is sensed by a sense amplifier. The boosted wordline voltage is typically achieved by voltage pump circuits. Such voltage pump circuits require additional power. They also require a power-up sequence to function properly.

DRAM cells also need to be refreshed periodically. Typically the cell content is sensed against a reference voltage of VCC/2. As a cell leaks its charge, its storage node voltage level shifts from VCC or 0 towards VCC/2. The content needs to be restored periodically by refresh operation.

The amount of time allowed between refreshes depends on the leakage current of the worst cell in the entire device. The refresh frequency is nearly directly proportional to the standby power required for a DRAM device. Put another way, an increase in refresh frequency results in a corresponding increase in standby power. Standby power (and power consumption in general) is particularly important for battery-operated systems such as mobile computing and telephony devices. A conventional SRAM cell generally has four or six transistors, with three terminals, WL, BL, and BL#, as illustrated in FIG. 2. These terminals are the wordline, bit line, and bit line complement, respectively, as is well known. To write the cell, VCC is applied to WL, and the data and its complement are applied to BL and BL#, respectively. To read the cell, VCC is applied to WL, and a voltage difference between BL and BL# is sensed by a sensing amplifier. No voltage above VCC is needed for the operation of the SRAM cell, so no voltage pumping circuits are required. And, no refresh is required; a conventional SRAM cell will retain the stored data as long as power is applied. However, the SRAM cell typically is more than 10 times larger than a DRAM cell in the same technology generation, so density is severely sacrificed.

U.S. Pat. No. 5,289,421 to Lee et al. ("Lee") is directed to a DRAM with low noise characteristics. Essentially, Lee describes a DRAM array in which each bit or memory cell comprises not one, but two "reference memory cells" arranged between a common wordline and a pair of adjacent bitlines as illustrated in FIG. 3 (of this application). The design proposed by Lee requires modification of the standard DRAM array which often requires modification to the manufacturing process (to connect pairs of cells to the common wordline), whereas standard array designs are available at lower cost.

A typical state-of-the-art DRAM array is shown in FIG. 4. This is known as a folded bitline architecture. Each array is made up of M rows (wordlines) and N columns (bitlines), where M and N are both even numbers. Each wordline is connected with N/2 cells (every other cell), and each bitline is connected with M/2 cells. During an access, one of the wordlines is asserted. The charge of the N/2 cells are transferred to the N/2 bitlines. The other N/2 bitlines do not receive charge transfer and therefore act as a reference for the sensing amplifier.

What is needed is a new memory design that provides high density, like DRAM, with reduced power consumption and low cost of manufacture.

SUMMARY OF THE INVENTION

One aspect of the invention is an improved memory cell design that provides many of the advantages of SRAM with much greater density than conventional SRAM. In a presently preferred embodiment, the improved memory device employs a variation of DRAM technology to store a data bit differentially, using a pair of DRAM cells located on two different rows of the array. Thus the cells are accessed by asserting not one, but two wordlines simultaneously. No voltage boosting is necessary above VCC, so power consumption is reduced, yet read margins are improved. Since margins are improved, refresh frequency is relaxed as well, which again saves power.

More specifically, a presently preferred embodiment of the invention calls for receiving a row address; responsive to the received row address, selecting a corresponding unique pair of rows of memory cells in the DRAM array; and simultaneously accessing the selected pair of rows in the DRAM array. For a write access, for example, a data bit is written into the DRAM array by differentially storing the data bit across a pair of memory cells, each one of the pair of memory cells being within a respective one the pair of rows selected by the decoder.

A new memory product that embodies the present invention still offers 5–10 times the density of conventional SRAM as only two transistors are required per storage cell. An SRAM-pin-compatible device represents one application. Such a product is well suited to battery-powered devices such as wireless data and telecom devices. Moreover, the cost to design and deploy the new differential memory is minimized because a standard memory array (the core matrix of cells) can be used, while the necessary modifications can be made to peripheral circuits around the array, namely wordline decoder/drivers.

Additional objects and advantages of this invention will be apparent from the following detailed description of preferred embodiments thereof which proceeds with reference to the accompanying drawings.

DETAILED DESCRIPTION OF PREFERRED EMBODIMENT

Figure 1:
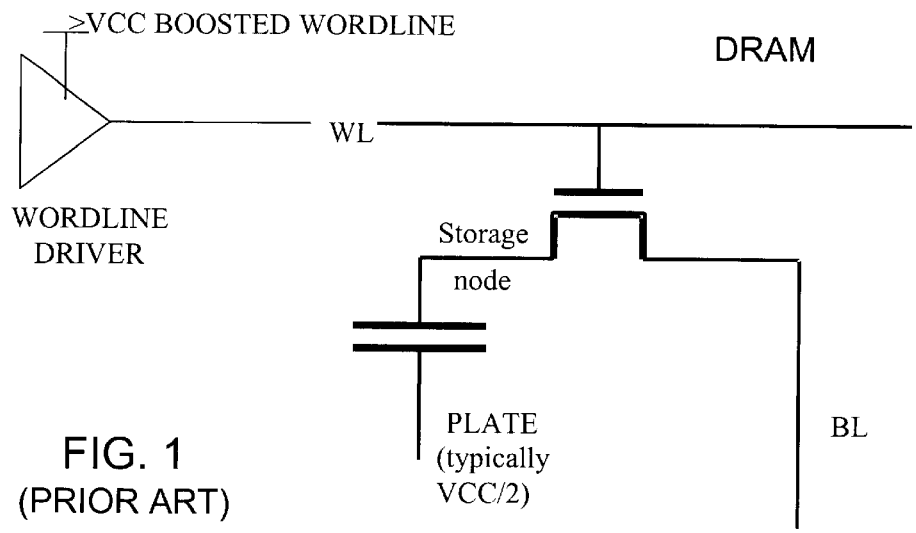
FIG. 1 is a simplified schematic diagram illustrating a single DRAM storage cell as is known in the prior art.
Figure 2:
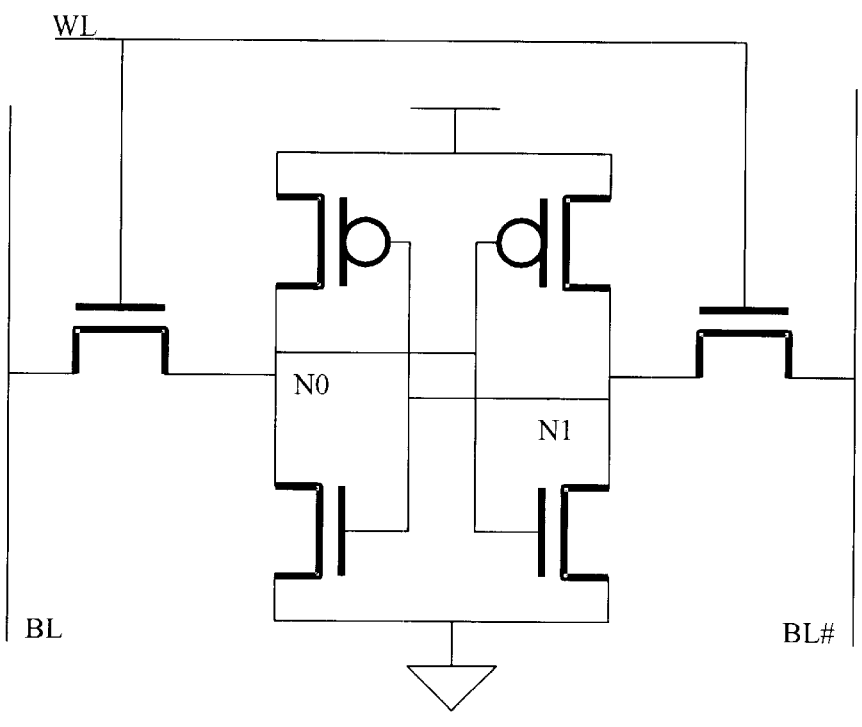
FIG. 2 is a simplified schematic diagram illustrating a single SRAM storage cell as is known in the prior art.
Figure 3:
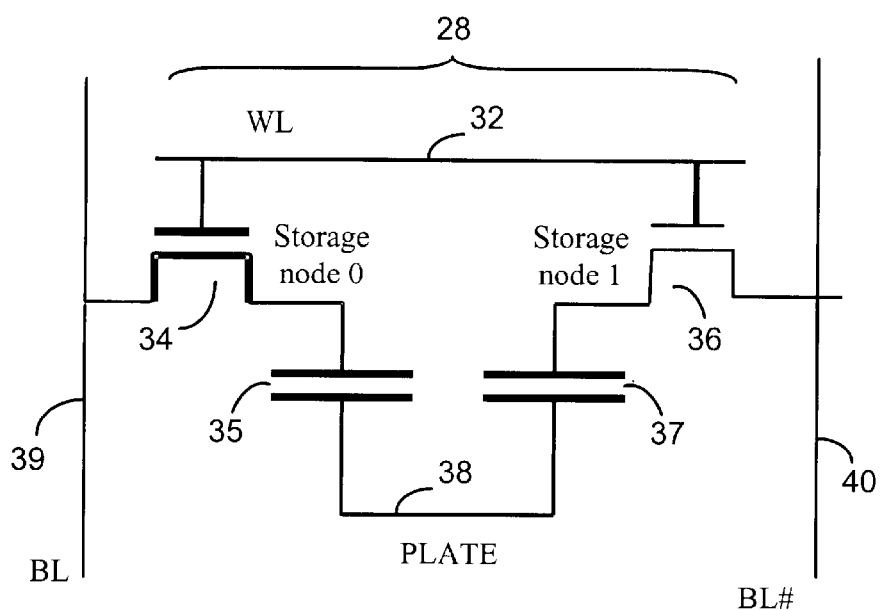
FIG. 3 is a schematic diagram illustrating a two-capacitor storage cell coupled to a single wordline as is known in the prior art.
Figure 4:
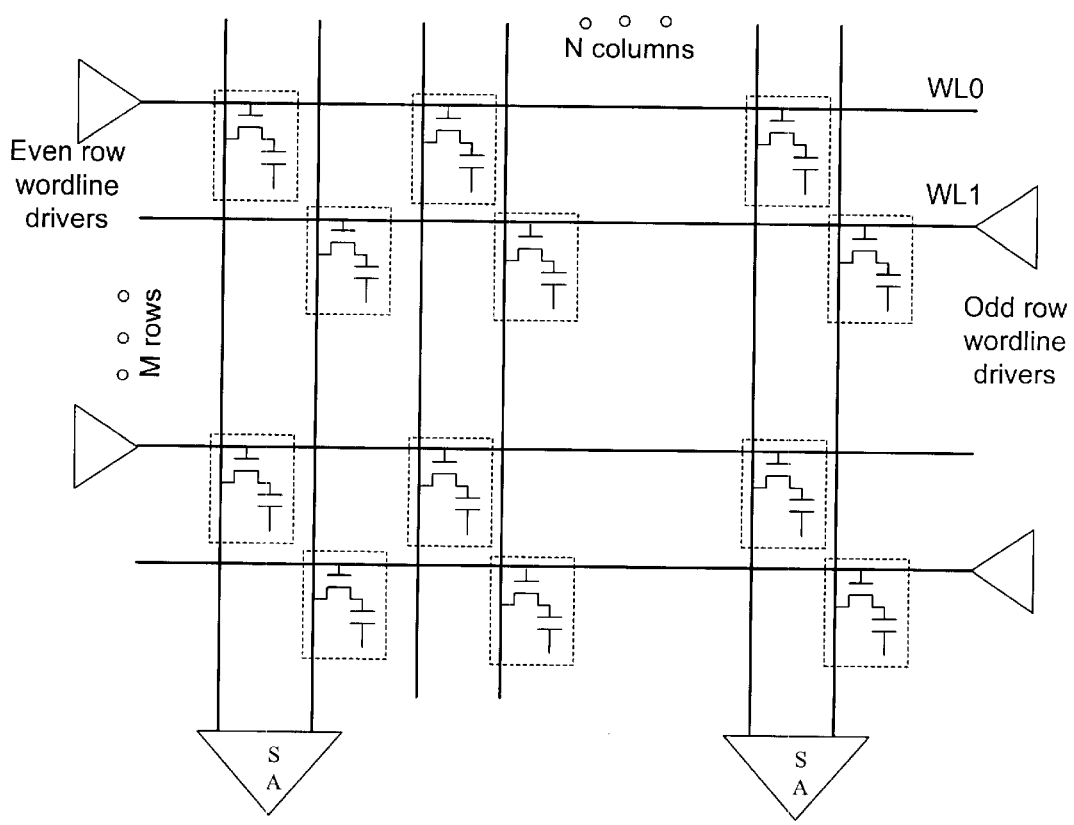
FIG. 4 is a simplified schematic diagram of a prior art DRAM array.
Figure 5:
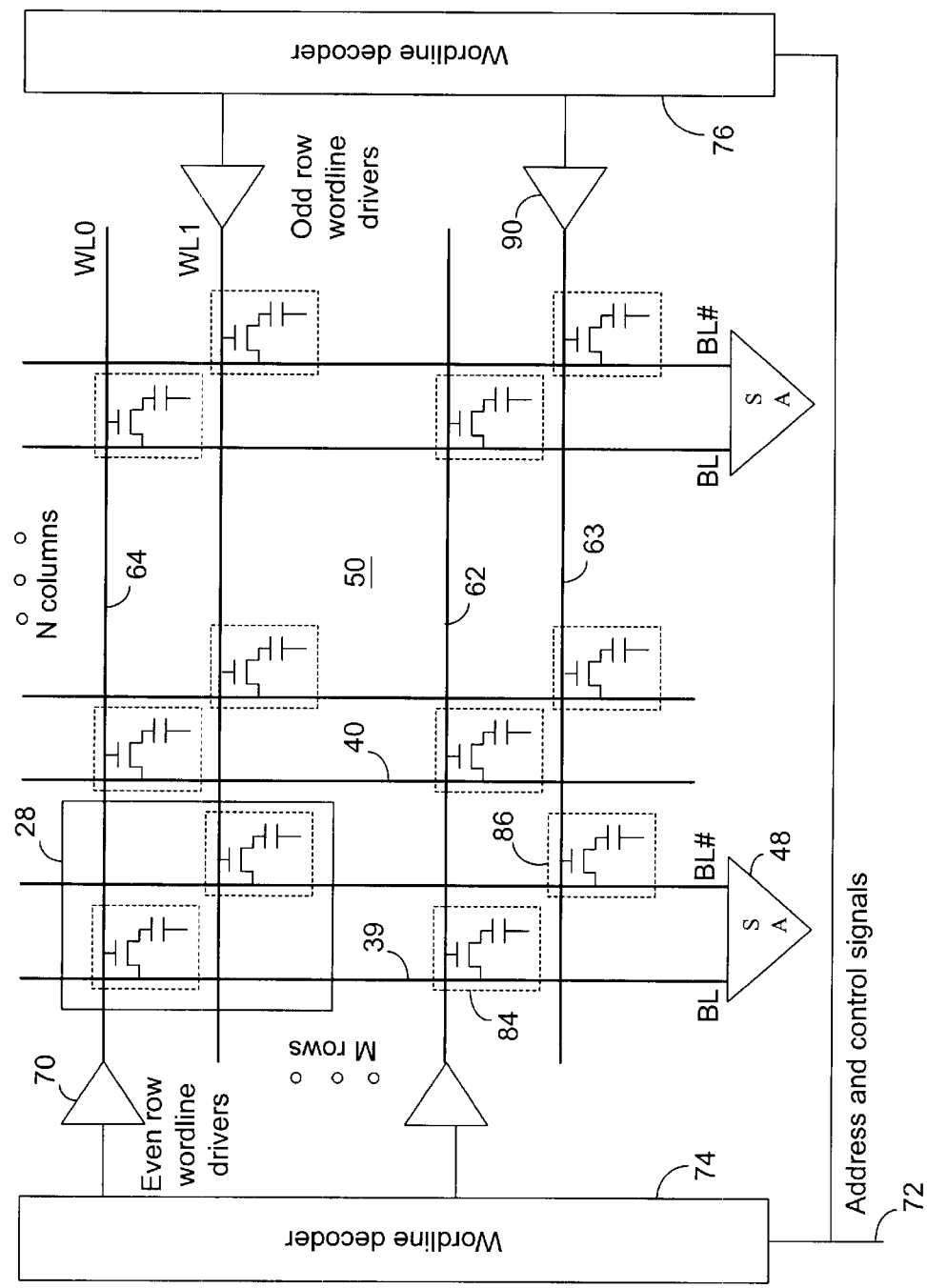
FIG. 5 is a simplified schematic diagram of a memory array according to the present invention.

FIG. 5 illustrates a memory device according to the present invention. In this device, a memory array 50 comprises a plurality of M rows of memory cells, similar to a conventional DRAM array. Each row comprises N individual memory cells (columns). The memory array, and typically the peripheral circuitry as well, are formed on a monolithic semiconductor substrate. Multiple arrays or blocks of memory can be incorporated on a single chip, as is known. This simplified illustration shows only a few cells, whereas practical devices are likely to include many millions of cells (megabits). Each row of memory cells is coupled to a corresponding wordline for accessing the row by assertion of the corresponding wordline. Each wordline is selectively asserted by a corresponding wordline driver circuit; for example, driver 70 is employed to assert wordline 64, much like conventional circuits.

According to the invention, a row address is input on a row address bus 72 to even and odd wordline decoder circuits 74,76 respectively. The wordline decoders select a corresponding unique pair of rows of memory cells in the DRAM array 50 in response to each valid address. Specifically, in this "folded bitline" arrangement, the wordline decoders simultaneously assert one even row wordline and one odd row workline in response to a given address. Conventional sense amps 48 are provided to read and write data to and from the cells of the selected rows. The sense amps are arranged to differentially store a bit of data across a pair of memory cells, where each one of the pair of memory cells is within a different respective row of the array, and the two different rows together correspond to one of the unique pairs of wordlines asserted by the row address decoder responsive to a valid row address. So, for example, if a wordline pair 62,63 is asserted in a write cycle, one bit of data would be stored differentially across memory cells 84,86 by sense amp 48. Although the pairs of wordlines illustrated are adjacent, they need not be so. Any unique pair of rows (wordlines), one even and one odd, can be used. So, for example, wordline drivers 70 and 90 could be used in tandem as a pair. In this illustration, however, we have identified a storage cell 28 (described below) that corresponds to an adjacent pair of wordlines. The memory cell array 50 is essentially a conventional DRAM design; the modifications necessary to implement the present invention can be done in the peripheral circuitry, particularly the wordline decoders.

Similar to an SRAM array, the wordline drivers are connected to VCC. No boosted voltage is required. As noted, the activation voltage of the wordlines in the memory array is VCC, rather than a boosted voltage greater than VCC as in conventional DRAM. The voltage levels stored in the memory cells are 0 and VCC−VTN, where VTN is the threshold voltage of the memory cell transfer device.

Figure 6:
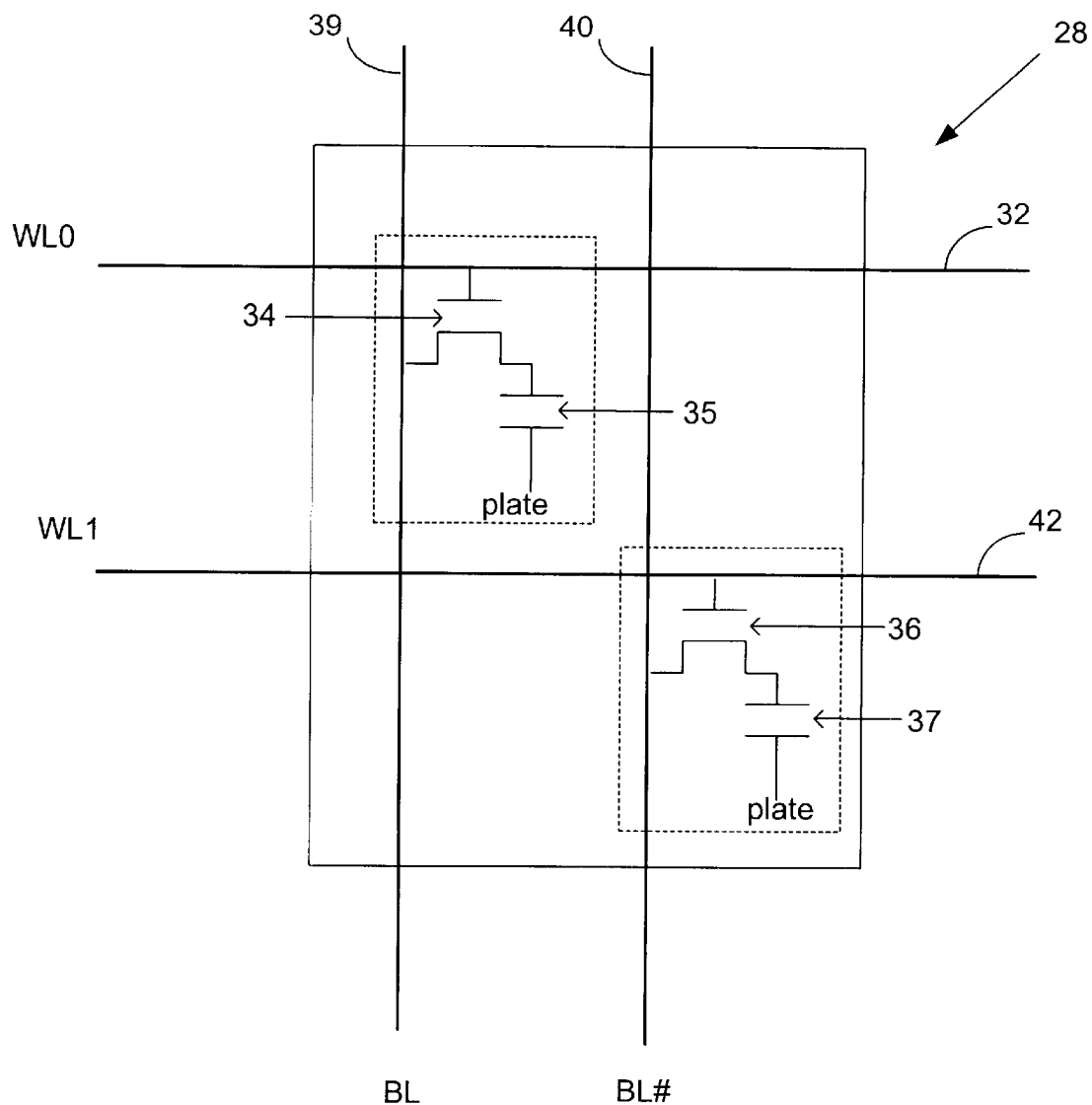
FIG. 6 is a schematic diagram illustrating a dual capacitor memory cell of FIG. 5 in greater detail.

Referring now to FIG. 6, each memory storage cell 28 includes circuitry that resembles a pair of DRAM cells. The memory storage cell 28 has 4 terminals—WL0, WL1, BL, and BL# (in addition to a PLATE terminal which is common among all cells of an array). The memory cell 28 comprises a first transistor 34 connected to a first capacitor 35, and a second transistor 36 connected to a second capacitor 37. The first transistor 34 is arranged to connect the bit line 39 to the first capacitor 35 in response to assertion of a first wordline 32. The second transistor 36 connects the bitline complement (BL#) 40 to the second capacitor 37 in response to assertion of WL1 42, 50 the two capacitors operate in tandem, each of them being connected to one of the pair of wordlines 32, 42.

In operation, the two-capacitor storage cell of FIG. 6 appears much like an SRAM cell. To write to the memory cell, VCC is applied to WL0 and WL1 while data and its complement are applied to BL and BL#. WL voltage does not need to be boosted above VCC. The resulting voltage levels in the storage nodes are 0 and VCC−VTN, where VTN is the threshold voltage of the transfer gate (transistor 34 or 36). To read the memory cell, VCC is applied to WL0 and WL1, and the voltage difference between BL and BL# is sensed by a sensing amplifier (see FIG. 5). The wordlines WL0 and WL1 voltage does not need to be boosted above VCC.

The invention provides several advantages over the prior art. First, the dual-wordline differential storage technique eliminates the need for boosted wordline voltage, and therefore the need for DRAM power-up sequence and additional power. In a conventional DRAM design, the storage node voltage is sensed against a reference voltage of VCC/2. A data bit of '0' is stored as 0 volts, and '1' is stored as VCC, giving a sensing margin of VCC/2. In order to store VCC in the cell, the gate of the transfer NMOS device must be boosted to a voltage at or above VCC+VTN. Without the boosted voltage, the highest voltage the storage node can reach is VCC−VTN, which greatly reduces sensing margin to VCC/2−VTN. In accordance with the present invention, the storage node voltages are sensed differentially against each other (via the bit lines). Even without a boosted wordline, the sensing margin is VCC−VTN, which is typically better than VCC/2. For example, in a typical current generation 64M DRAM, VCC is typically 3.3 volts and VTN is typically 1.2 volts. By eliminating the boosted voltage, the DRAM power-up sequence can be eliminated. The additional power required by voltage pumps is also eliminated.

Moreover, the differential storage cell described above greatly reduces refresh frequency, reduces power, and increases yield. In conventional DRAM, the refresh interval is determined by the worst case (most leaky) cell in the device. The practical refresh interval using the present invention is expected to be 100–1000 times greater (longer interval, i.e. lower refresh frequency) than that needed for a conventional DRAM cell. The refresh interval required by a typical cell is often referred to as "intrinsic" refresh interval.

In accordance with this invention, the refresh interval is still dictated by the worst case storage cell. The new storage cell, however, can be analogized to a pair of conventional DRAM cells in that it includes two charge storage elements (typically capacitors). The probability of having both storage elements defective in the same cell is far smaller than that of having one defective conventional cell. This probability may be made even lower by selecting non-adjacent rows in defining the wordline pairs. The refresh interval in this invention approaches intrinsic refresh interval. The lower refresh frequency translates to lower power consumption. The differential storage cell, compared to single DRAM cells, effectively has built-in redundancy. This redundancy improves yield. In other words, even if one storage node is somewhat defective, the differential storage cell may still satisfy all operational criteria. Further, the differential storage cell is 5–10 times smaller than an SRAM cell of the same technology generation. Since most of the area of a typical memory product is occupied by the array, new products can be built having 10 to 20 times the density of conventional SRAM.

It will be obvious to those having skill in the art that many changes may be made to the details of the above-described embodiment of this invention without departing from the underlying principles thereof. The scope of the present invention should, therefore, be determined only by the following claims.

What is claimed is:

1. A high-density, low-power, semiconductor memory product comprising:

a memory array formed on a unitary semiconductor substrate, the memory array including a plurality of rows of memory cells, each row of memory cells coupled to a corresponding wordline for accessing the row by assertion of the corresponding wordline;

a row address decoder arranged for receiving a row address and including means for simultaneously asserting a corresponding unique pair of the wordlines in response to each received valid row address, so that a single valid row address simultaneously accesses two rows of memory cells in the memory array; and means for differentially storing a bit of data across a pair of memory cells, each one of the pair of memory cells being within a different respective row of the array, and the two different rows together corresponding to one of the unique pairs of wordlines asserted by the row address decoder responsive to a valid row address.

2. The semiconductor memory product according to claim 1 wherein the memory array is formed with MOS transistors.

3. The semiconductor memory product according to claim 2 wherein the memory array comprises a DRAM array.

4. The semiconductor memory product according to claim 3 wherein the DRAM array comprises a folded-bitline architecture and each unique pair of wordlines consists of one even row wordline and one odd row wordline.

5. The semiconductor memory product according to claim 1 wherein each unique pair of wordlines asserted by the row address decoder consists of an adjacent pair of wordlines in the memory array.

6. The semiconductor memory product according to claim 5 wherein the memory array is formed with MOS transistors.

7. The semiconductor memory product according to claim 6 wherein the memory array comprises a DRAM array.

8. The semiconductor memory product according to claim 7 wherein the row address decoder drives the selected pair of wordlines to a voltage no greater than VCC.

9. The semiconductor memory product according to claim 8 and further comprising a pin-compatible SRAM interface for utilizing the product in an SRAM application.

10. A method of operation of a DRAM array comprising the steps of:

(a) receiving a row address;

(b) responsive to the received row address, selecting a corresponding unique pair of rows of memory cells in the DRAM array; and (c) simultaneously accessing the selected pair of rows in the DRAM array.

11. The method according to claim 10 wherein said accessing step includes writing a data bit into the DRAM array by differentially storing the data bit across a pair of memory cells, each one of the pair of memory cells being within a respective one the selected pair of rows.

12. The method according to claim 10 wherein said accessing step includes reading a data bit from the DRAM array by differentially sensing the data bit across a pair of memory cells, each one of the pair of memory cells being within a respective one the selected pair of rows.

13. The method according to claim 10 wherein said selecting step comprises selecting a non-adjacent pair of rows of memory cells.

14. The method according to claim 10 wherein said accessing step comprises driving a pair of wordlines corresponding to the selected pair of rows to a voltage no greater than an external supply voltage Vcc.

* * * * *